(12) United States Patent
Ito et al.

(10) Patent No.: US 7,804,316 B2
(45) Date of Patent: Sep. 28, 2010

(54) PUSHER, PUSHER UNIT AND SEMICONDUCTOR TESTING APPARATUS

(75) Inventors: Akihiko Ito, Tokyo (JP); Tsuyoshi Yamashita, Tokyo (JP); Tomoyuki Kanaumi, Tokyo (JP)

(73) Assignee: Advantest Corporation (JP)

( * ) Notice: Subject to any disclaimer, the term of this patent is extended or adjusted under 35 U.S.C. 154(b) by 162 days.

(21) Appl. No.: 12/016,211

(22) Filed: Jan. 18, 2008

(65) Prior Publication Data

US 2009/0102497 A1 Apr. 23, 2009

Related U.S. Application Data

(63) Continuation of application No. PCT/JP2005/013409, filed on Jul. 21, 2005.

(51) Int. Cl.
*G01R 31/02* (2006.01)
(52) U.S. Cl. .................. 324/757; 324/754; 324/760
(58) Field of Classification Search .................. None
See application file for complete search history.

(56) References Cited

U.S. PATENT DOCUMENTS 5,640,303 A * 6/1997 Hooley ..................... 361/699
6,301,097 B1 * 10/2001 Ellsworth et al. .......... 361/728
6,573,739 B1 * 6/2003 Saito ........................ 324/755

FOREIGN PATENT DOCUMENTS

| JP | 07239362 | 9/1995 |
|---|---|---|
| JP | 09-33606 | 2/1997 |
| JP | 09175647 | 7/1997 |
| JP | 10058367 | 3/1998 |
| JP | 11-329646 | 11/1999 |
| JP | 11-344527 | 12/1999 |
| JP | 2000171521 | 6/2000 |
| JP | 2002-5990 | 1/2002 |
| JP | 2002160187 | 6/2002 |
| JP | 2002174658 | 6/2002 |

OTHER PUBLICATIONS

Chinese Office Action in counterpart application, No. CN 200580061125.6, dated Dec. 18, 2009, citing JP7-239362, JP11-344527, and JP2002-160187. Each of these Japanese references and an English Language Abstract thereof have been previously filed in an IDS on Jan. 18, 2008. Partial translation of the Chinese Office Action is attached as a concise explanation of relevance.

* cited by examiner

*Primary Examiner*—Vinh P Nguyen
(74) *Attorney, Agent, or Firm*—Chen Yoshimura LLP

(57) ABSTRACT

A pusher 200 that pushes a semiconductor device under test 300 against a test socket 500 in a semiconductor test apparatus 20 is provided that includes a main body section 210 that is thermally coupled with the thermal source 400 and a plurality of device pushing sections 220, each of which is physically and thermally coupled to the thermal source 400, is displaced toward the test socket 500 by the pushing force of the main body section 210 to contact a surface to be pushed of a semiconductor device under test 300, pushes the semiconductor device under test 300, and transmits heat from the thermal source 400 to the semiconductor device under test 300. Thermal conductivity between the pusher and the semiconductor device under test is enhanced to provide a pusher that can quickly and accurately test a semiconductor device.

13 Claims, 13 Drawing Sheets

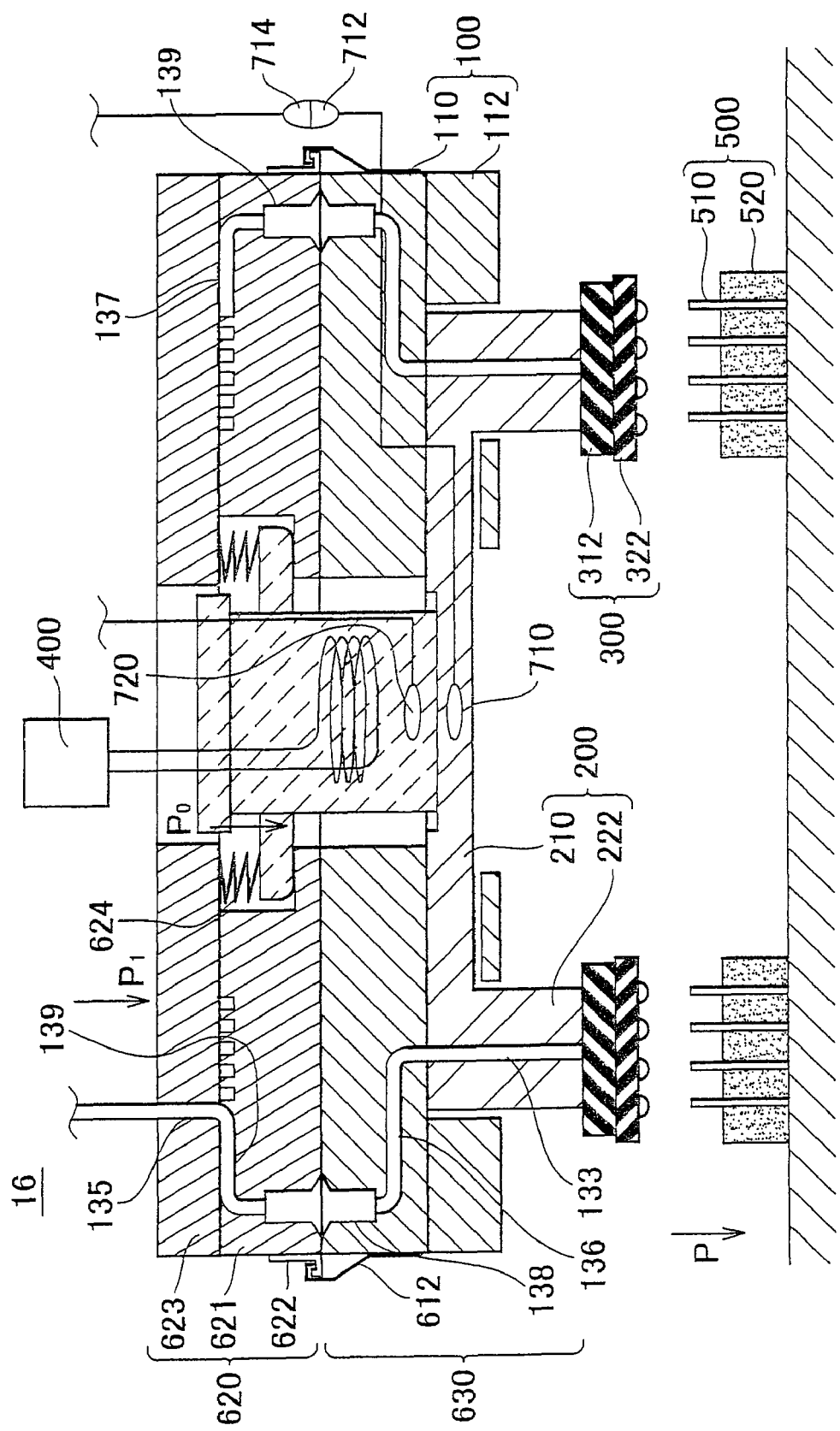
F I G. 12

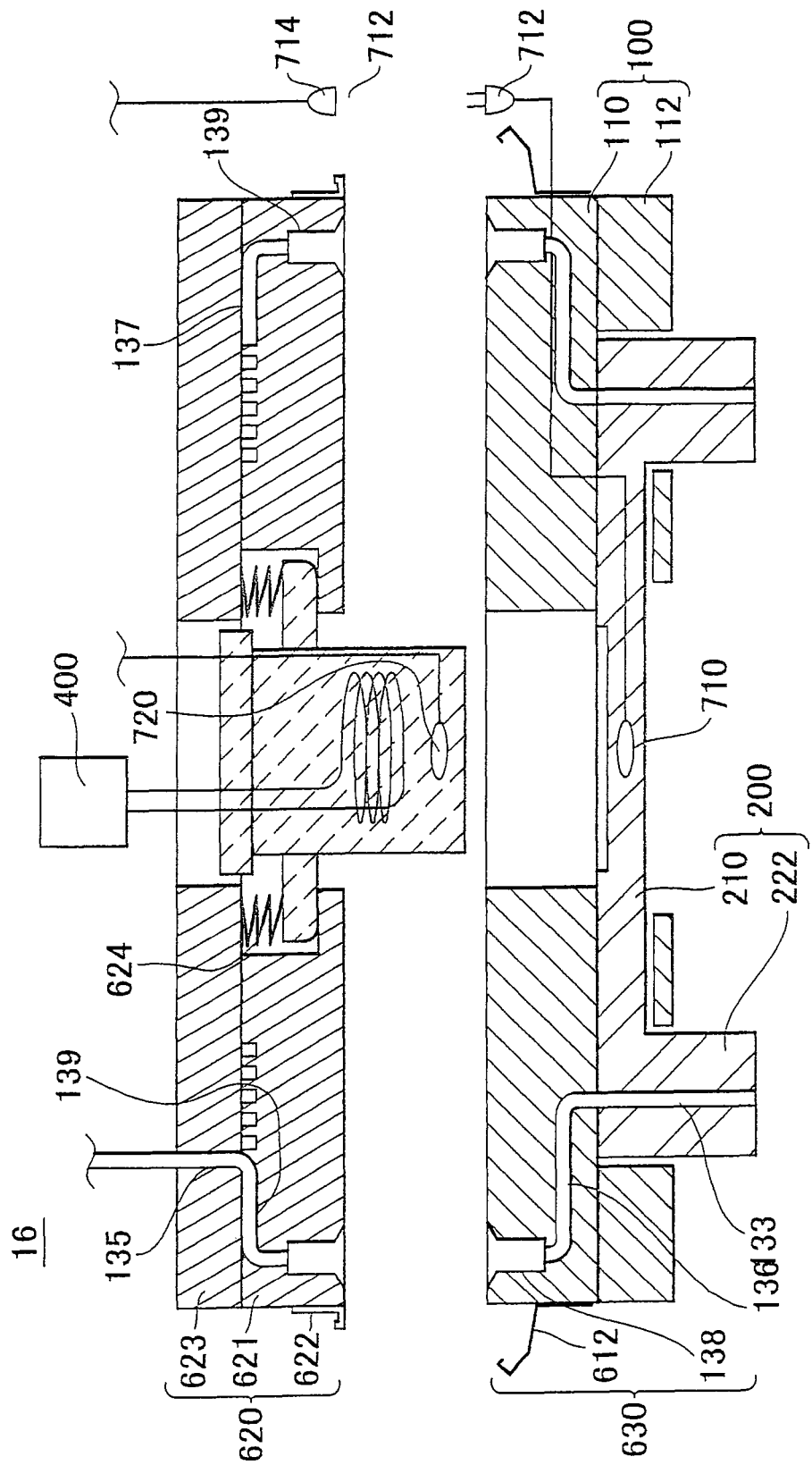
F I G. 13

PUSHER, PUSHER UNIT AND SEMICONDUCTOR TESTING APPARATUS

CROSS REFERENCE TO RELATED APPLICATION

This is a continuation application of PCT/JP2005/013409 filed on Jul. 21, 2005, the contents of which are incorporated herein by reference.

BACKGROUND

1. Technical Field

The present invention relates to a pusher, a pusher unit, and a semiconductor test apparatus. More particularly, the present invention relates to a pusher unit that carries a semiconductor device under test to attach the semiconductor device under test to a test socket in a semiconductor test apparatus, a pusher that is attached to the pusher unit, and a semiconductor test apparatus provided with the pusher unit.

2. Related Art

A semiconductor test apparatus sequentially feeds semiconductor devices under test to a position above test sockets, pushes the semiconductor devices under test, performs testing for each of the semiconductor devices under test according to a prescribed test program provided to a test section, and sorts and carries the semiconductor devices under test according to the test results. In the series of operations performed by such a semiconductor test apparatus, the pusher unit carries the semiconductor devices under test and pushes the semiconductor devices under test onto the test sockets.

The pusher unit of the semiconductor test apparatus is provided with a holding section that holds one semiconductor device under test for each carrying process. The holding section is connected to a decompression source and holds the semiconductor device under test through suction. Furthermore, the pusher unit is provided with a pusher that pushes the semiconductor device under test held by the holding section onto the test socket. The pusher includes a pushing section that directly contacts the semiconductor device under test or a substrate thereof to push the semiconductor device under test or the substrate thereof and a main body section that supports the pressing section and transfers the pushing force applied by the pushing section.

In Japanese Patent Application Publication No. hei09-175647, a semiconductor test apparatus is proposed that can perform a continuous process by cooling the semiconductor device under test during carriage by disposing a plurality of carrying sections that receive and pass the semiconductor device under test. Furthermore, in Japanese Patent Application Publication No. hei10-058367, an IC feeding apparatus is disclosed that is configured to correspond to a slant of the semiconductor device under test caused by deformation of a tray that houses the semiconductor device under test.

In Japanese Patent Application Publication No. 2000-171521 providing an apparatus that carries the semiconductor device under test by using a negative pressure to hold the semiconductor device under test with a function that cools the semiconductor device under test by blowing air thereon is proposed. In Japanese Patent Application Publication No. 2002-174658, enhancing efficiency of the test process by loading and unloading the semiconductor device under test with an independent carrying apparatus is proposed

SUMMARY

Therefore, it is an object of an aspect of the innovations herein to provide a pusher, a pusher unit, and a semiconductor test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a pusher that includes a plurality of device pushing sections that are thermally coupled to a common thermal source. In the pusher, each of the plurality of device pushing sections contacts a surface to be pushed of a semiconductor device under test and pushes the surface to be pushed such that each of the semiconductor devices under test is pushed onto a test socket of a semiconductor test apparatus and heat from the thermal source is transmitted to the semiconductor devices under test.

According to a second aspect related to the innovations herein, one exemplary apparatus may include a pusher that includes a main body section and a device pushing section that is supported on the main body section in a manner to move in relation to the main body section. In the pusher, the device pushing section contacts a surface to be pushed of a semiconductor devices under test, closely contacts the surface to be pushed by moving to conform to a slant of the surface to be pushed, and uniformly pushes the surface to be pushed to push the semiconductor device under test against a test socket of a semiconductor test apparatus.

According to a third aspect related to the innovations herein, one exemplary apparatus may include a pusher unit that holds a semiconductor devices under test in a semiconductor test apparatus and pushes the semiconductor devices under test against a test socket. The pusher unit includes a thermal source, a pusher that pushes the semiconductor devices under test against the test socket and that transmits heat from the thermal source to the semiconductor devices under test, and a holding section that holds the semiconductor devices under test.

According to a fourth aspect related to the innovations herein, one exemplary apparatus may include a semiconductor test apparatus including a pusher that includes a thermal source, a main body section that is thermally coupled with the thermal source, and a device pushing section that is physically and thermally coupled with the main body section; a pusher unit that includes a holding section that supports a semiconductor devices under test; and a test section that performs testing of the semiconductor devices under test attached to a test socket by the pusher unit.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 12 is a cross-sectional view showing a pusher unit 16 formed by attaching another change kit 630 to the permanent section 620 shown in FIG. 10.

FIG. 13 is a cross-sectional view showing a condition in which the change kit 630 is separated from the pusher unit 16 shown in FIG. 10.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
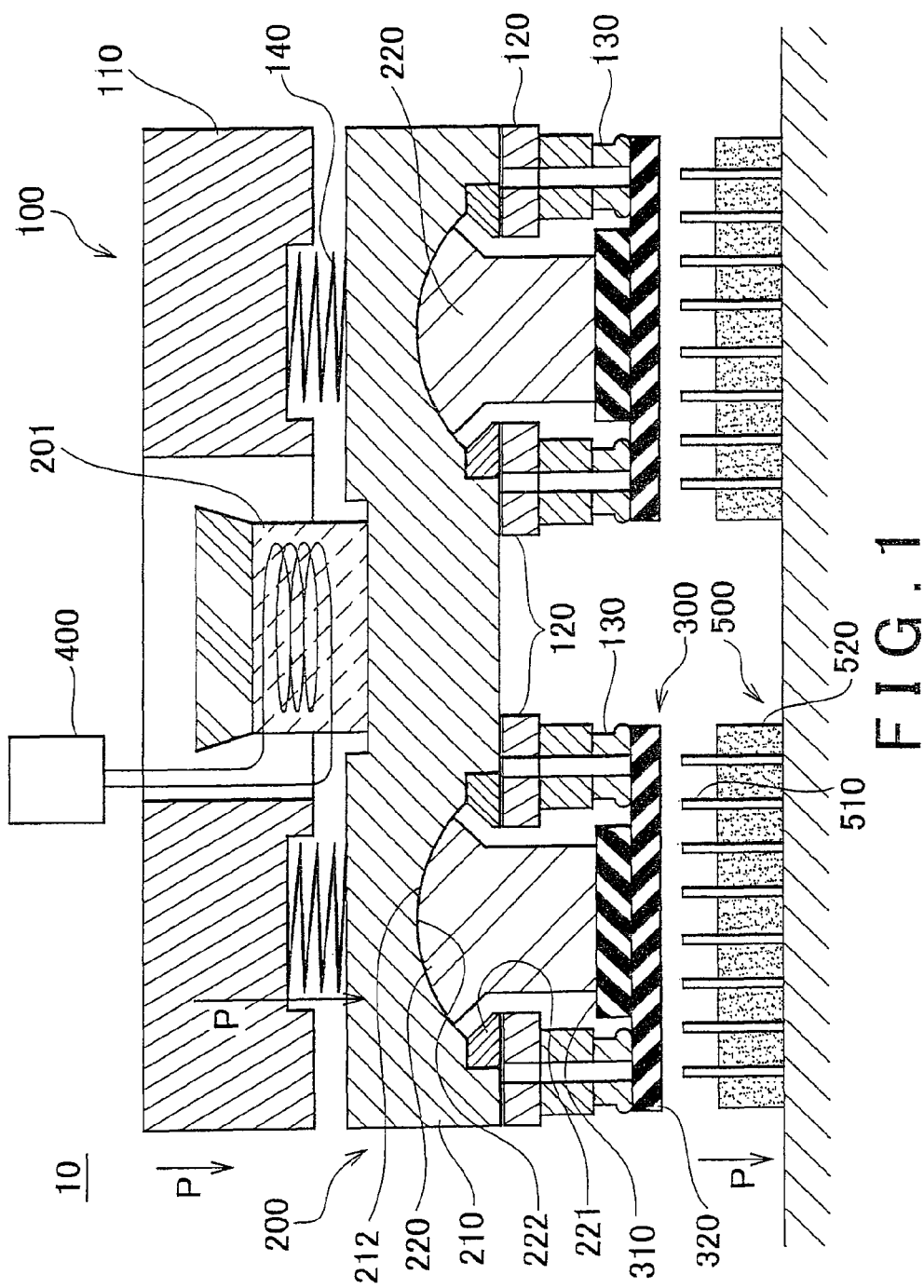
FIG. 1 is a vertical cross-sectional view showing a configuration of a pusher unit 10.

FIG. 1 is a vertical cross-sectional view showing a configuration of a pusher unit 10. As shown in FIG. 1, the pusher unit 10 is combined with a unit case 100 and is provided with a pusher 200, which is provided with a pair of device pushing sections 220.

The unit case 100 includes a case upper section 110 that receives a pushing force P from a pushing force generating section, not shown in FIG. 1, and case lower sections 120 to which holding sections 130 are attached. The case upper section 110 and the case lower sections 120 are joined in an integrated manner.

The holding sections 130 are attached to the case lower sections 120. An internal section of the holding sections 130 is connected to a decompression source, not shown, so that the holding sections 130 hold through suction a flat substrate 320 of semiconductor devices under test 300 described hereinafter. It should be noted that a position, number, and arrangement of the holding sections 130 shown in FIG. 1 are examples, and change depending on the shape of the semiconductor devices under test 300. Accordingly, there are also cases where the holding sections 130 are disposed on the device pushing sections 220, for example.

A main body section 210 of the pusher 200 is positioned between the case upper section 110 and the case lower sections 120. Push springs 140 are arranged between the case upper section 110 and the main body section 210, and the pushing force P applied to the case upper section 110 is transmitted to the main body sections 210 via the push springs 140. Accordingly, the unit case 100 and the pusher 200 rise or fall in an integrated manner. Here, in the present embodiment, a through hole is formed in a vicinity of a center of the case upper section 110, so that an upper surface of the main body section 210 can extend upward without interference when the main body section rises in relation to the case upper section 110.

The main body section 210 is provided with a thermal coupling section 201 on the upper surface thereof and is connected to an external thermal source 400. The external thermal source 400 is a heating source or a cooling source that keeps the semiconductor devices under test 300 at a desired test temperature that is higher or lower than room temperature. As a first example of a specific configuration of the thermal coupling section 201, a component that is connected to a medium tube in which a fluid heated or cooled by the thermal source 400 flows such that the temperature of the component can be raised or lowered is given. Alternatively, as a second example, a configuration is given in which the thermal coupling section 201 is provided with, in addition to the external heating source or cooling source, a Peltier element and a control apparatus that controls an amount and direction of a current for the Peltier element to be the desired amount and direction. The thermal coupling section 201 described above transmits heat to and from the semiconductor devices under test 300 via the main body section 210 of the pusher 200. When testing is to be performed only at high temperatures, the cooling source may be omitted. Furthermore, there are cases where the thermal coupling section 201 is further provided with a heater for heating. Yet further, a heating response can be quickened by arranging the Peltier element in the thermal coupling section 201, so that more stable temperature control can be performed.

Because the thermal coupling section 201 is arranged in the center of the main body section 210, the heat from the thermal coupling section 201 is uniformly transferred to both ends of the main body section 210. Here, the word "heat" is used for convenience, but in a case where the temperature of the thermal source 400 is lower than the temperature of the thermal coupling section 201, the thermal coupling section 201 is cooled, thereby cooling the main body section 210.

The main body section 210 is provided with a pair of device pushing sections 220 separated from each other and attached to a vicinity at both ends of a lower surface of the main body section 210 in a horizontal direction. Each device pushing section 220 extends until a bottom of the case lower sections 120 and has a flat pushing surface on a lower surface thereof. Here, the holding sections 130 are formed to surround a perimeter of the pushing surface of the device pushing section.

A rounded end 222 is formed on an upper end of each device pushing section 220. The rounded end 222 directly contacts a cradle section 212 that is formed on the lower surface of the main body section 210 in a manner to have a rounded surface with the same curvature as the rounded end 222. Accordingly, the device pushing section 220 can rotate smoothly by moving the rounded end 222 along the inner surface of the cradle section 212. Therefore, because the device pushing section 220 can rotate smoothly in response to the pushing of the pusher unit 10, even in a case where the lower surface of the device pushing section 220 contacts a base 310 at a slanted angle, a contact surface of the device pushing section 220 can uniformly contact the semiconductor devices under test.

Because the cradle section 212 of the main body section 210 and the rounded end 222 of the device pushing section 220 have complementary shapes and are in close contact with each other, there is almost no fluctuation in heat conduction characteristics. Accordingly, the heat conduction characteristics between the main body section 210 and the device pushing section 220 do not change, even when the device pushing section 220 moves as described above. A stopper 221 are attached to the periphery of the cradle section 212 to prevent the device pushing section 220 from falling.

It is desirable that the pusher 200 that includes the device pushing sections 220 and the main body section 210 be formed of a material that has good thermal conductivity. More specifically, copper or an alloy composed mainly of copper, aluminum or an alloy composed mainly of aluminum, alumina, or ceramics such as aluminum nitride can be given as examples of such a material, but the material used is not limited to these examples. Furthermore, in order to enhance durability of the pusher 200, smooth the rubbing between the rounded end 222 and the cradle section 212, or the like, it is desirable that surfaces of the aforementioned metallic materials be covered in a hard material such as ceramics or undergo a plating process with a hard metal or the like.

Furthermore, in order to enhance lubrication between the cradle section 212 and the rounded end 222 and improve the thermal coupling by decreasing the tiny gap between the cradle section 212 and the rounded end 222, it is desirable that a lubricant having high thermal conductivity be provided between the cradle section 212 and the rounded end 222. Here, silicon oil dispersed with ceramics such as alumina or oxidized titanium is given as an example of the lubricant having high thermal conductivity.

The main body section 210 and the device pushing sections 220 closely contact each other either directly or via the aforementioned lubricant. In this manner, the thermal coupling section 201, the main body section 210 and the device pushing sections 220 are thermally coupled. It is desirable that each device pushing section 220 be pressed upwards and supported by a spring component, not shown, such that the rounded end 222 and the cradle section 212 are constantly in gentle contact with each other.

FIG. 1 further schematically shows a type of test region in the semiconductor test apparatus 20 described hereinafter. In the condition shown in FIG. 1, the pusher unit 10 is positioned above the pair of test sockets 500. Each test socket 500 has a plurality of contact pins 510 formed with a frame 520 in an integrated manner. The semiconductor device under test 300 given as an example of the semiconductor device under test 300 that is tested by using the test socket 500 includes the substrate 320 provided with the base 310, and device terminals for achieving an electrical connection are provided on the lower surface of the substrate 320.

In the testing process of the semiconductor devices under test 300, the pusher unit 10 formed as described above carries the semiconductor devices under test 300 to be tested, which are held on the holding sections 130 by suction, to the test region where the test sockets 500 are positioned.

In the test region, when the semiconductor devices under test 300 arrive above the test sockets 500, the pusher unit 10 lowers the semiconductor devices under test 300 and begins pushing. By doing this, the device terminals of the semiconductor devices under test 300 are brought into contact with the contact pins 510. Furthermore, through the pushing of the bases 310 by the pushing surfaces of the device pushing sections 220, each device terminal is pressed strongly onto the contact pins 510. At this time, the device pushing sections 220 continue to be pushed after contacting the flat surfaces while smoothly rotating.

As a result of the continued pushing, a uniform pushing force can be applied to the flat surfaces of the bases 310 of the semiconductor devices under test 300. Accordingly, a stable contact thermal resistance in relation to the semiconductor devices under test 300 can be achieved, so that the testing can be performed in a condition where the devices are at a stable temperature. Furthermore, because a partial excessive pushing stress is not placed on the bases 310, degradation or damage of the devices is prevented.

Because the pushing surface of each device pushing section 220 and each base 310 are in close contact with each other, the heat transmitted from the thermal source 400 via the thermal coupling section 201 and the main body section 210 is also efficiently transmitted from the device pushing section 220 to the base 310. Accordingly, two semiconductor devices under test 300 can both be held at roughly the same temperature by setting an appropriate temperature for a single thermal coupling section 201.

As a result of this, two semiconductor devices under test 300 can commonly use a single system of the thermal coupling section 201 and a connection path to the thermal source 400. Accordingly, a higher density of devices can be equipped than in a case where two separate systems including the thermal coupling section 201 and the connection path to the thermal source 400 are provided, which results in a lower cost and smaller size. Furthermore, because the power consumption during testing of two semiconductor devices under test 300 is approximately equal for each semiconductor device under test 300, the temperature can be effectively managed by a single thermal coupling section 201 system.

The pusher unit 10 according to the present embodiment is provided with a pair of device pushing sections 220, and therefore two semiconductor devices under test 300 can be handled at the same time. By doing this, the number of simultaneous measurements can be increased by equipping a high density during the testing process in the semiconductor test apparatus 20.

It should be noted that there are cases where a surface of the base 310 has a slight incline and is not horizontally flat because of a manufacturing variation or the like. Furthermore, in a case where two semiconductor devices under test 300 in a pair have different heights, there is a concern that a device pushing section 220 contacts only a portion of the base 310. In the present embodiment, however, because the device pushing section 220 is displaced by the reactive force of the base 310 when the base 310 is pushed, the pushing surface conforms to the surface being pushed of the slanted base 310 to closely contact the surface being pushed. Furthermore, even when the device pushing section 220 moves, close contact can be achieved between the main body section 210 and the device pushing section 220. Accordingly, even when the device pushing section 220 and the base 310 are slanted, favorable thermal conduction can be maintained for the semiconductor devices under test 300.

Figure 2:
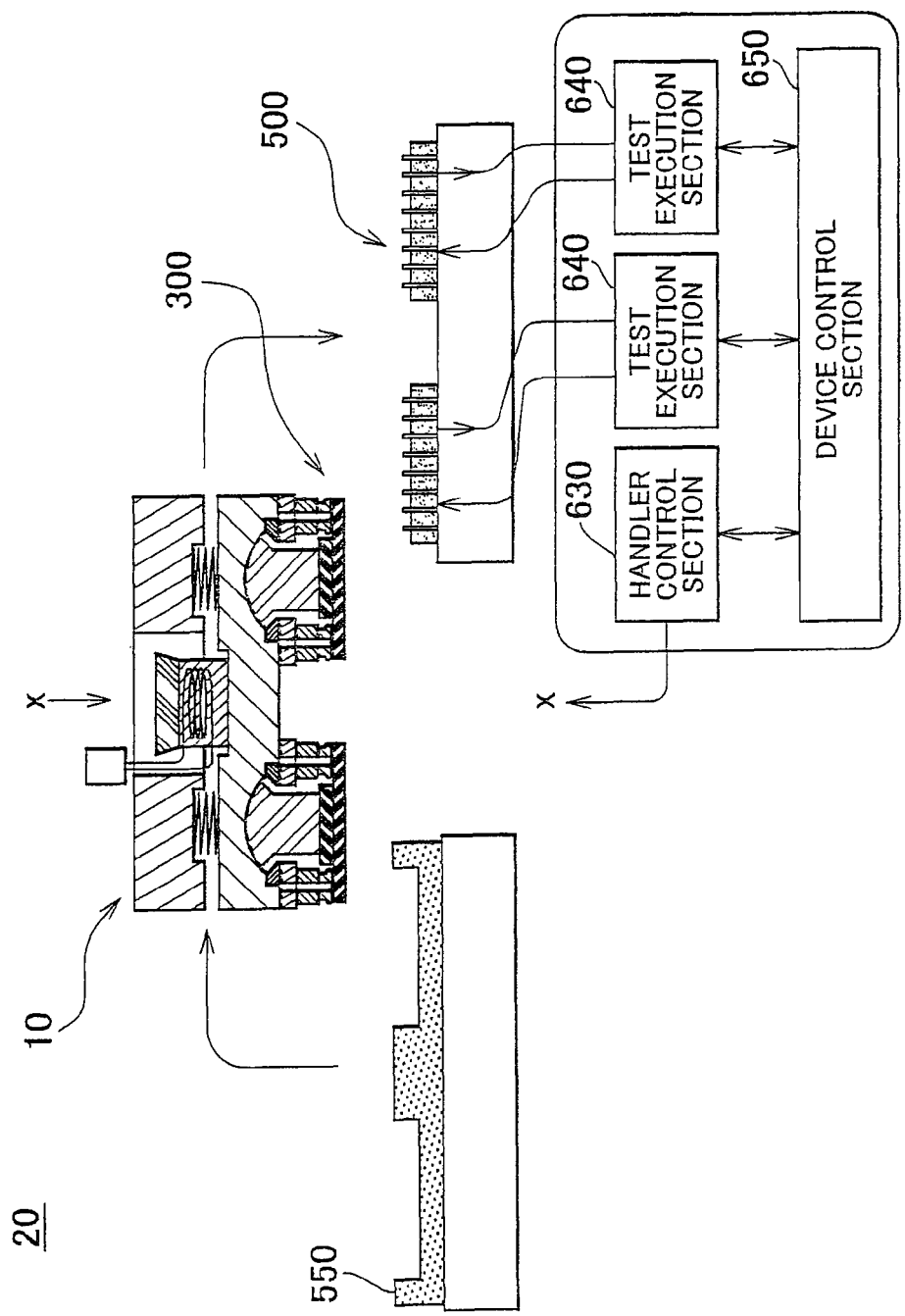
FIG. 2 schematically shows a configuration of a semiconductor test apparatus 20 provided with the pusher unit 10.

FIG. 2 schematically shows a configuration of the semiconductor test apparatus 20 provided with the pusher unit 10 described above in FIG. 1. As shown in FIG. 2, the semiconductor test apparatus 20 is provided with a handler 610 that includes the pusher unit 10 and a test section 620 that is connected to the handler 610.

The test section 620 performs an electrical test of the semiconductor devices under test 300 when the semiconductor devices under test 300 are in a condition contacting the test sockets 500. The test section 620 is provided with a handler control section 630 that controls communication between the handler 610 and the pusher unit 10 and a test execution section 640 that performs in the handler 610 a test of each semiconductor devices under test 300 loaded onto the test socket 500. The test section (tester main body) 620 is provided with a device control section 650 that executes overall control of the operation of the test section 620 that includes the handler control section 630 and the test execution section 640.

The handler 610 performs electrical testing of the semiconductor devices under test 300 by sequentially feeding the plurality of semiconductor devices under test 300 from a stacker, not shown, and sequentially pushing the semiconductor devices under test 300 onto the test sockets 500. A plurality of feeding trays 550 are included in the stacker and a multitude of semiconductor devices under test 300 are loaded into each feeding tray 550. The semiconductor devices under test 300 are sequentially fed from the feeding trays 550 by a feeding apparatus, not shown, to be passed to the pusher unit 10.

A plurality of semiconductor devices under test 300 are fed by the pusher unit 10 and lowered into the test region while held by suction to the pusher unit 10, and two semiconductor devices under test 300 are then pushed onto the test sockets 500. This operation is controlled by a control apparatus, not shown, in the handler while communicating with the handler control section 630 on the test section 620 side. In the overall operation of the semiconductor test apparatus 20, the handler 610 side and the test section 620 side operate in conjunction to simultaneously perform testing of the devices and the carrying control while receiving test initiation information, test completion information, pass/fail judgments or classification information of the test results, or other types of communication information.

In the test region, when the semiconductor devices under test 300 arrives above the test sockets 500, the pusher unit 10 falls to bring the semiconductor devices under test 300 into contact with the test sockets 500. Furthermore, because the pusher unit 10 pushes the semiconductor devices under test 300 against the test sockets 500, an electrical connection is formed between the device terminals of the semiconductor devices under test 300 and the corresponding contact pins 510 of the test socket 500.

In the contacting condition described above, the test execution section 640 performs testing to obtain information such as pass/fail judgment information or electrical characteristics of each semiconductor device under test 300 from the test results. Classification information obtained from classification based on the aforementioned information is sent to the control apparatus in the handler via the handler control section 630. The handler control section 630 feeds the tested semiconductor devices under test 300 using the pusher unit 10 or another feeding apparatus, not shown, to store the tested semiconductor devices under test 300 in a stacker corresponding to the classification information.

The semiconductor test apparatus 20, as shown in FIG. 1, is provided with the pusher unit 10 that includes the pusher 200 provided with the plurality of device pushing sections 220 for a single main body section 210. Furthermore, each pusher 200 can maintain uniform temperature control of two semiconductor devices under test 300 by using a single thermal source 400 and a single thermal coupling section 201. Accordingly, a higher density of devices can be equipped than in a case where the semiconductor test apparatus is provided with a single thermal source and device pushing section, which results in a lower cost and smaller size. Furthermore, the cost of testing is decreased because a greater number of semiconductor devices under test can be measured at the same time, even in the same test region.

Figure 3:
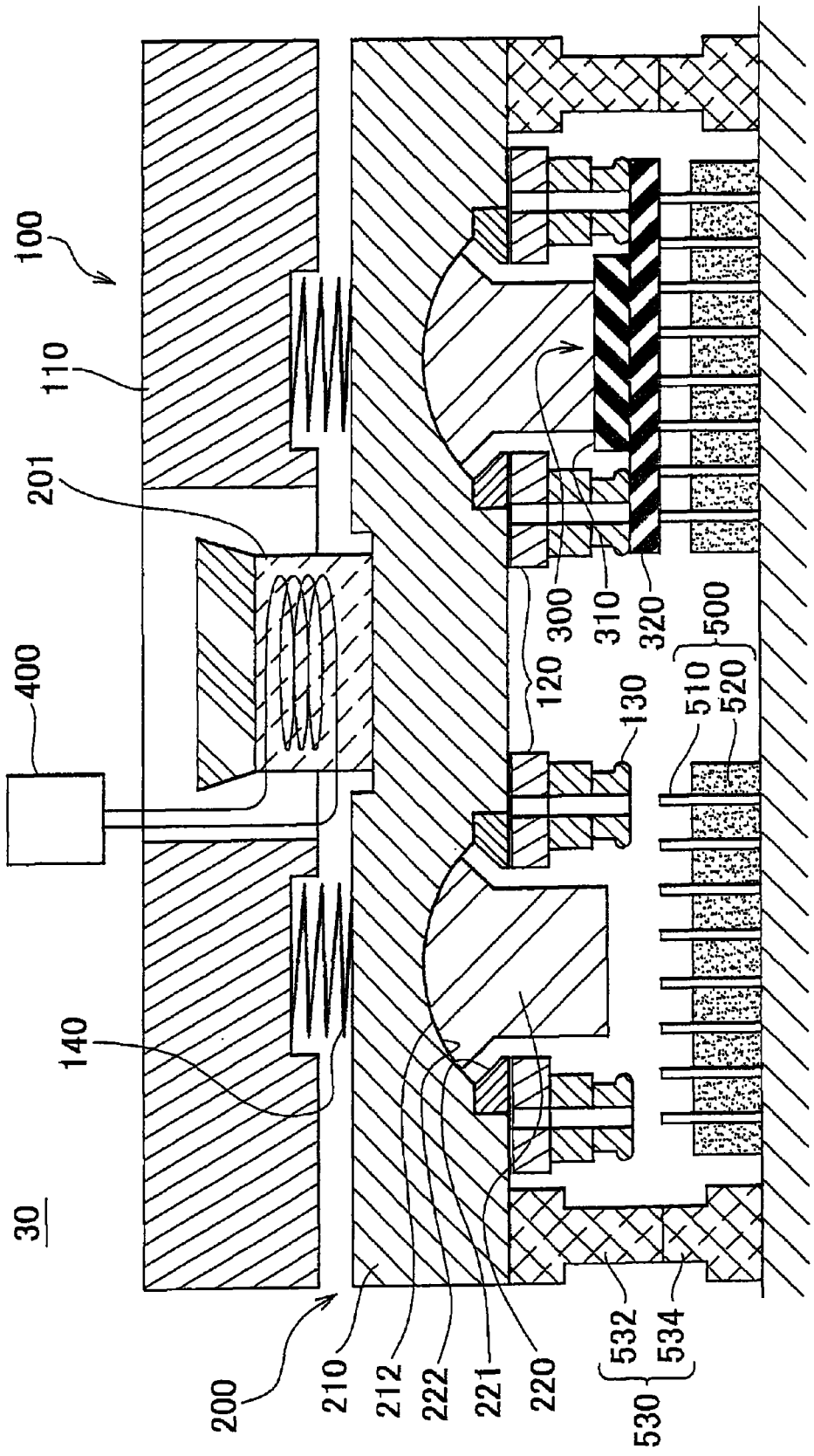
FIG. 3 is a cross-sectional view showing the configuration of a pusher unit 30 according to another embodiment.

FIG. 3 is a vertical cross-sectional view showing the configuration of a pusher unit according to another embodiment. In FIG. 3, structural elements common to the pusher unit 10 of FIG. 1 are given the same reference numerals and identical descriptions are omitted.

As shown in FIG. 3, in the present embodiment, the test region configuration differs from the that of FIG. 1 in that a pair of regulating components 530 are attached to outer sides of a pair of test sockets 500. The regulating components 530 include a bumper 532 fixed to the main body section 210 of the pusher 200 and a bumper 534 fixed to the test socket 500 side, and are arranged vertically in line with a rising and falling direction of the pusher unit 30. Accordingly, when the pusher unit 30 falls below a predetermined range, the bumpers 532, 534 contact each other to prevent the pusher unit 30 from falling further.

It is desirable that the height to which the regulating component 530 allows the pusher unit 30 to fall does not interfere with the pushing of the semiconductor devices under test 300 by the device pushing sections 220. To achieve this, the height of the bumpers 532, 534 is set such that the bumpers 532, 534 do not contact each other until the device pushing sections 220 reach a height at which the semiconductor devices under test 300 are properly loaded onto the test sockets 500.

One of the bumper pairs 532, 534 described above is disposed for each device pushing section 220. By doing this, even where one of the holding sections 130 is not provided with a semiconductor device under test 300, the pushing condition of the semiconductor device under test 300 held by the other set of holding sections 130 can be held constant to prevent application of an excessive pushing force. Furthermore, damage to the test socket 500 caused by the device pushing section 220 on the empty side falling below the acceptable height can be avoided, thereby preventing the holding section 130 on the other side from becoming significantly slanted.

Figure 4:
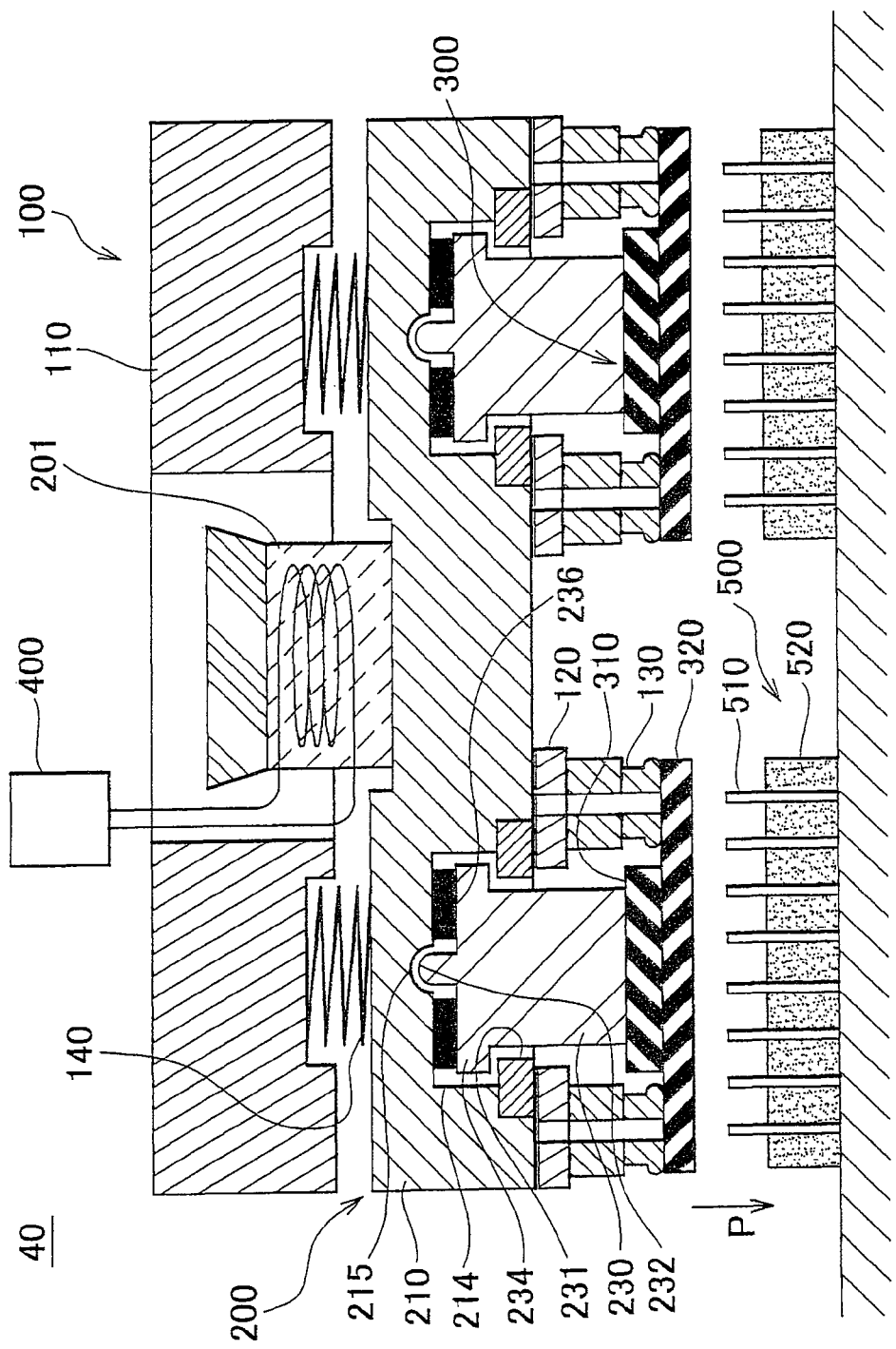
FIG. 4 is a cross-sectional view showing the configuration of a pusher unit 40 according to another embodiment.

FIG. 4 is a vertical cross-sectional view showing a configuration of a pusher unit 40 according to another embodiment. In FIG. 4, structural elements common to other Figures are given the same reference numerals and identical descriptions are omitted. Furthermore, the pusher unit 40 has a configuration identical to that of the pusher unit 10 shown in FIG. 1, aside from the shape and attachment configuration of device pushing sections 240 being different.

As shown in FIG. 4, in the pusher unit 40, each device pushing section 230 has a flange section 234 around a rim of an upper end thereof and has a projecting protrusion 232 in the center of the upper end. A tip of the protrusion 232 is formed in a substantially circular shape. Other regions of the upper end of each device pushing section 230 are formed as flat end surfaces. On a lower surface of the main body section 210, containing chambers 214 are formed that have a diameter that can house the flange section 234 of each device pushing section 230 in order to house an upper portion of the device pushing section 230. Furthermore, in the center of a ceiling surface of each containing chamber 214, a depression 215 is formed into which the protrusion 232 of the device pushing section 230 enters.

Furthermore, an elastic sheet 236 having high thermal conductivity is inserted between the ceiling surface of each containing chamber 214 and the upper surface of the device pushing section 230. By doing this, the device pushing section 230 is pushed by the main body section 210 via the elastic sheet 236. Furthermore, by inserting the elastic sheet 236, the device pushing section 230 and the main body section 210 are thermally coupled. A stopper 231, having an internal diameter that is smaller than an external diameter of the flange section 234, is attached at a periphery of a lower end of the containing chamber 214 to prevent the device pushing section 230 from falling.

The elastic sheet 236 having high thermal conductivity is sometimes referred to as a thermal conduction sheet. It is desirable that the thermal conduction be constantly maintained by setting the space between the stopper 231 and the flange section 234 such that the device pushing section 230 gently pushes on the elastic sheet 236.

At a time when the pusher unit 40 configured as described above holds the semiconductor devices under test 300 and lowers the semiconductor devices under test 300 onto the test sockets 500, the lower surface of the substrate 320 of each semiconductor device under test 300 is brought into contact with the contact pins 510 of each test socket 500. In this condition, when the pusher unit 40 falls further, the lower surface of each device pushing section 230 pushes the base 310 more strongly.

Because of this stronger pushing, the elastic sheet 236 is compressed and the semiconductor device under test 300 can be held at a desired height because the protrusion 232 contacts the inner surface of the depression 215 to function as a stopper, thereby fixing the position of the semiconductor device under test 300. On the other hand, in regards to slanting, displacement at an appropriate angle can be achieved by the elastic sheet 236, so that the device pushing section 230 and the base 310 can be held in close contact with each other. Accordingly, stable thermal conduction can be maintained. In such a manner, a favorable electrical connection can be ensured between the device terminals of the semiconductor device under test 300 and the contact pins 510 of the test socket 500.

In a case where the surface of the base 310 itself is slanted because of a manufacturing variation or the like, there is a concern that the device pushing section 230 contacts only a portion of the base 310. In the present embodiment, however, because each device pushing section 230 can be displaced at a slant in relation to the main body section 210 due to the compression and expansion of the elastic sheet 236, the device pushing section 230 can conform to the slant of the surface of the base 310, so that close contact can be formed therebetween. Accordingly, thermal conduction is possible across all contacting surfaces of the device pushing section 230 and the semiconductor device under test 300. In such a case, the elastic sheet 236 compresses by being pushed in a pushing direction of the device pushing section 230, but when the protrusion 232 contacts the depression 215, the device pushing section 230 further pushes the base 310 without further compressing the elastic sheet 236.

Figure 5:
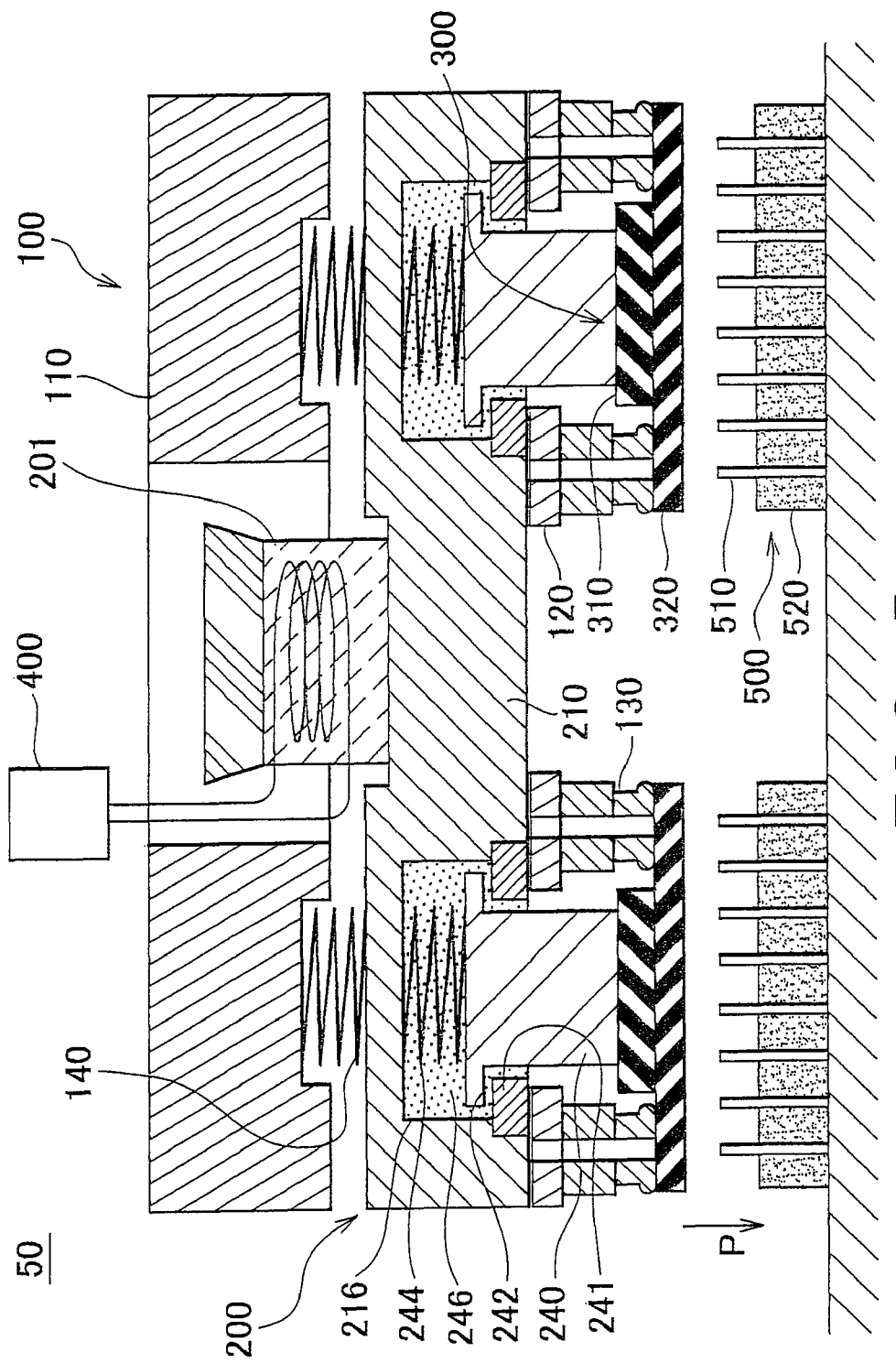
FIG. 5 is a cross-sectional view showing the configuration of a pusher unit 50 according to another embodiment.

FIG. 5 is a vertical cross-sectional view showing the configuration of a pusher unit 50 according to another embodiment. In FIG. 5, structural elements common to other Figures are given the same reference numerals and identical descriptions are omitted. Furthermore, the pusher unit 50 has the device pushing sections 240 with a different shape and attachment configuration.

As shown in FIG. 5, in the pusher unit 50, an upper end of each device pushing section 240 has a flat end surface and has a flange section 242 formed around a periphery thereof. On the lower surface of the main body section 210, containing chambers 216 are formed that have diameters that can house the flange sections 242 of the device pushing sections 230 and that house the upper portions of the device pushing sections 240. Furthermore, a fluid 246 having high thermal conductivity fills the containing chambers 216 to maintain favorable thermal conduction between the main body section 210 and the device pushing sections 240.

A stopper 241 having an internal diameter that is smaller than an external diameter of the flange section 242, is attached at a periphery of a lower end of the containing chamber 216 to prevent the device pushing section 240 from falling. Furthermore, the device pushing section 240 is sealed by affixing an O-ring or the like (not shown), so that the fluid 246 does not leak to the outside. It is preferable that the fluid 246 be a fluid with superior thermal conductivity, such as silicon solution, silicon grease, or mercury.

A push spring 244 is inserted between an upper end surface of the device pushing section 240 and a ceiling surface of the containing chamber 216 to press down on the device pushing section 220. By doing this, each device pushing section 240 is attached in a manner to be elastically supported by the main body section 210 and can be displaced in a pushing direction.

At a time when the pusher unit 50 configured as described above holds the semiconductor device under test 300 and lowers the semiconductor device under test 300 onto the test socket 500, the lower surface of the substrate 320 of the semiconductor device under test 300 is brought into contact with the contact pins 510 of the test socket 500. In this condition, when the pusher unit 40 falls further, the lower surface of the device pushing section 240 being pushed down by the push spring 244 pushes the base 310 more strongly. At this time, the device pushing section 240 and the base 310 are brought into close contact with one another by being moved to the appropriate slant by the fluid 246. Accordingly, stable thermal conduction can be maintained.

Furthermore, in a case where the thickness of the base 310 varies for some reason or a case where there is a variation in height from the substrate to the base 310, each device pushing section 220 is independently displaced by the elasticity of each push spring 244, so that the device pushing section 220 closely contacts the surface of the semiconductor device under test 300. Accordingly, heat can be transferred effectively from the device pushing section 230 to the semiconductor device under test 300. Furthermore, a problem in which an excessive or insufficient pushing force is applied to one of the two semiconductor devices under test 300 is prevented.

Figure 6:
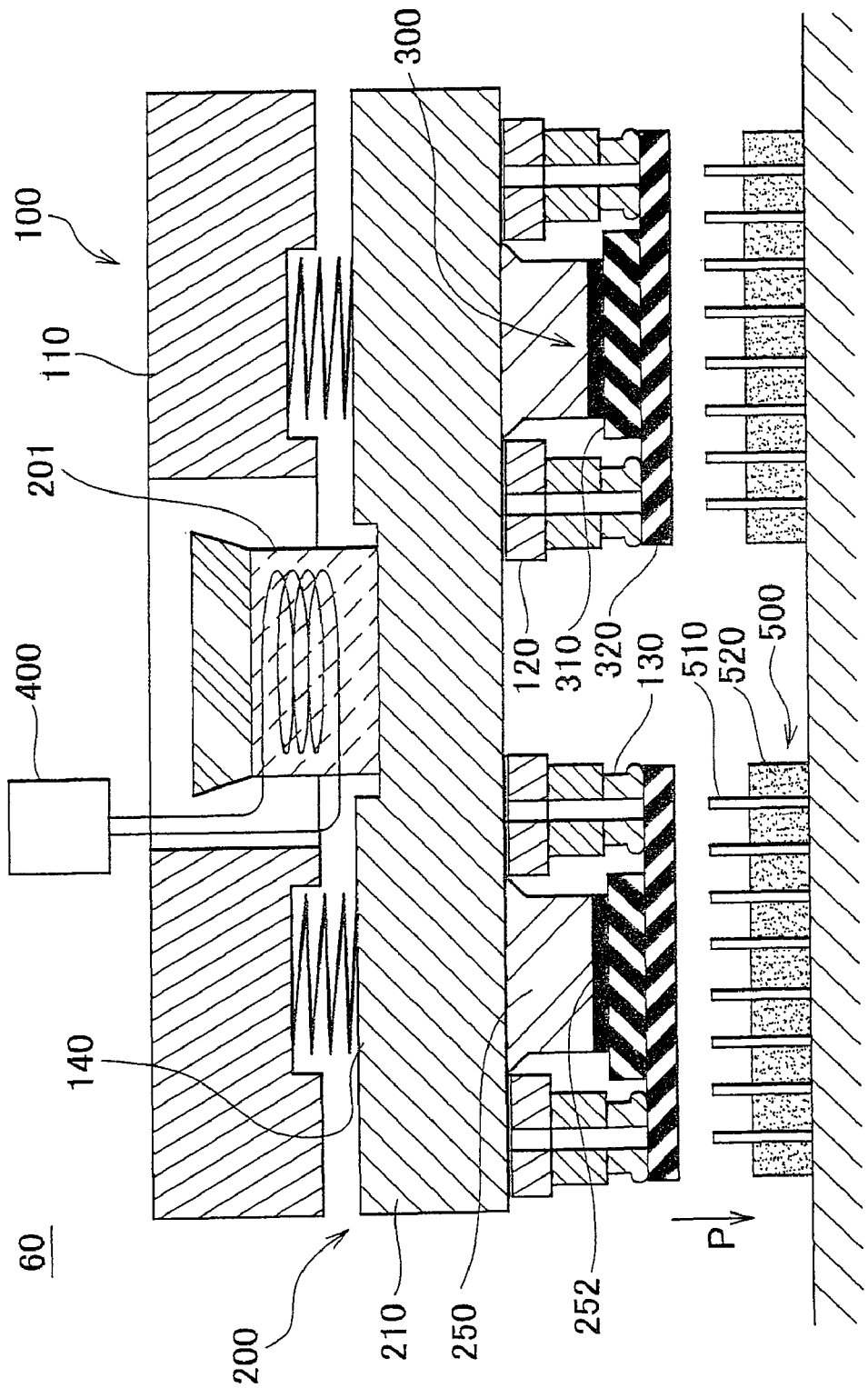
FIG. 6 is a cross-sectional view showing the configuration of a pusher unit 60 according to another embodiment.

FIG. 6 is a vertical cross-sectional view showing the configuration of a pusher unit 60 according to another embodiment. In FIG. 6, structural elements common to other Figures are given the same reference numerals and identical descriptions are omitted. Furthermore, the pusher unit 60 has a device pushing sections 250 with a different shape and attachment configuration.

As shown in FIG. 6, in the pusher unit 60, the device pushing sections 250 and the main body section 210 are formed in an integrated manner, which results in favorable thermal conduction between the device pushing sections 250 and the main body section 210. An elastic sheet 252 having high thermal conductivity is affixed to a lower end surface of each device pushing section 250. Accordingly, the device pushing section 250 pushes the semiconductor devices under test 300 via the elastic sheet 252.

By using the elastic sheet 252, the pushing surface of the device pushing section 250 can closely contact the surface of the base 310, regardless of variations in the slant or width of the base 310. Furthermore, the device pushing section 250 can be caused to closely contact the base 310 by the elasticity of the elastic sheet 252, even when there are small bumps in the surface of the base 310. Accordingly, thermal conduction between the pusher 200 and the semiconductor devices under test 300 is increased.

Figure 7:
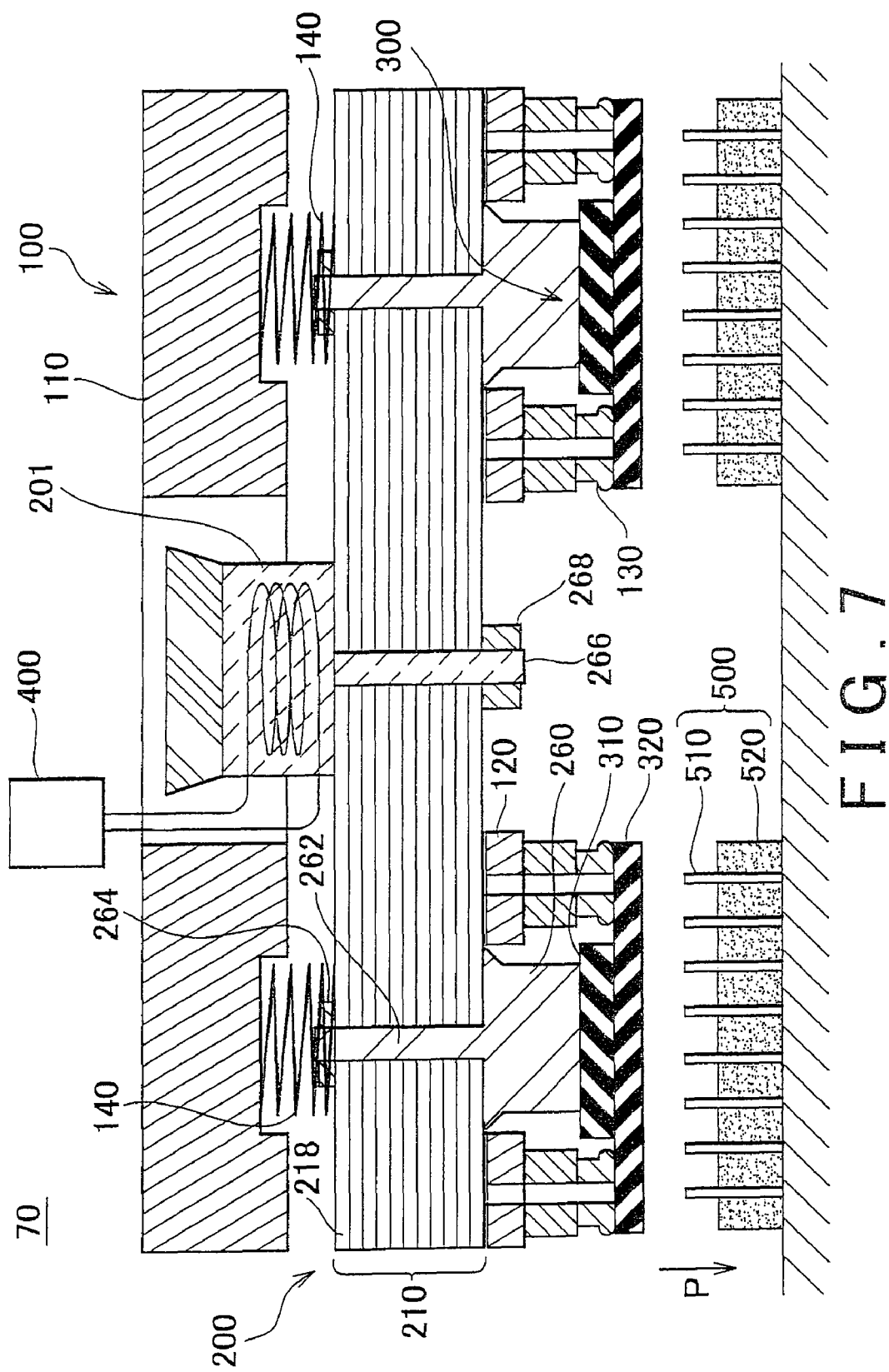
FIG. 7 is a cross-sectional view showing the configuration of a pusher unit 70 according to another embodiment.

FIG. 7 is a vertical cross-sectional view showing the configuration of a pusher unit 70 according to another embodiment. In FIG. 7, structural elements common to the pusher unit 60 of FIG. 6 are given the same reference numerals and identical descriptions are omitted.

As shown in FIG. 7, in the pusher unit 70, the main body section 210 of the pusher 200 is formed by laminating a plurality of sheet materials 218 (e.g., graphite sheets) providing good thermal conduction, each of which can be elastically deformed. In a vicinity at both ends of the sheet material 218, feedthrough sections 262 extending upwards from the device pushing section 260 and nuts 264 attached at tips of the feedthrough sections 262 are disposed as fastening components to fasten the sheet materials 218 together. A central section of the main body section 210 also includes a feedthrough section 266 extending downwards from the thermal coupling section 201 and a nut 268 attached to a tip of the feedthrough section 266 that fasten the sheet materials 218 together.

It should be noted that even at any one of the fastening locations, the sheet materials 218 are not adhered to each other and therefore can be altered independently from one another. On the other hand, because the sheet materials 218 fastened at a fastening location contact one another forcefully, heat is effectively transmitted therebetween. Furthermore, two push springs 140 are disposed between the main body section 210 and the case upper section 110 at positions corresponding to the device pushing sections 220. Accordingly, when the unit case 100 is displaced downward, the pusher 210 is pushed via the push springs 140.

When the main body section 210 formed in the manner described above pushes the semiconductor devices under test 300, the sheet materials 218 bend in response to the reactive force received from each base 310. Accordingly, the sheet materials 218 deform according to a displacement, a slant, or the like of the base 310, so that the device pushing section 260 is caused to closely contact the base 310, which results in favorable thermal conduction being maintained between the device pushing section 260 and the base 310.

In the present embodiment, the push springs between the unit case 100 and the main body section 210 are omitted because the main body section 210 itself is elastic. Furthermore, a configuration is shown in which the thermal coupling section 201 positioned in the center of the main body section 210 is pushed directly by the unit case 100.

Figure 8:
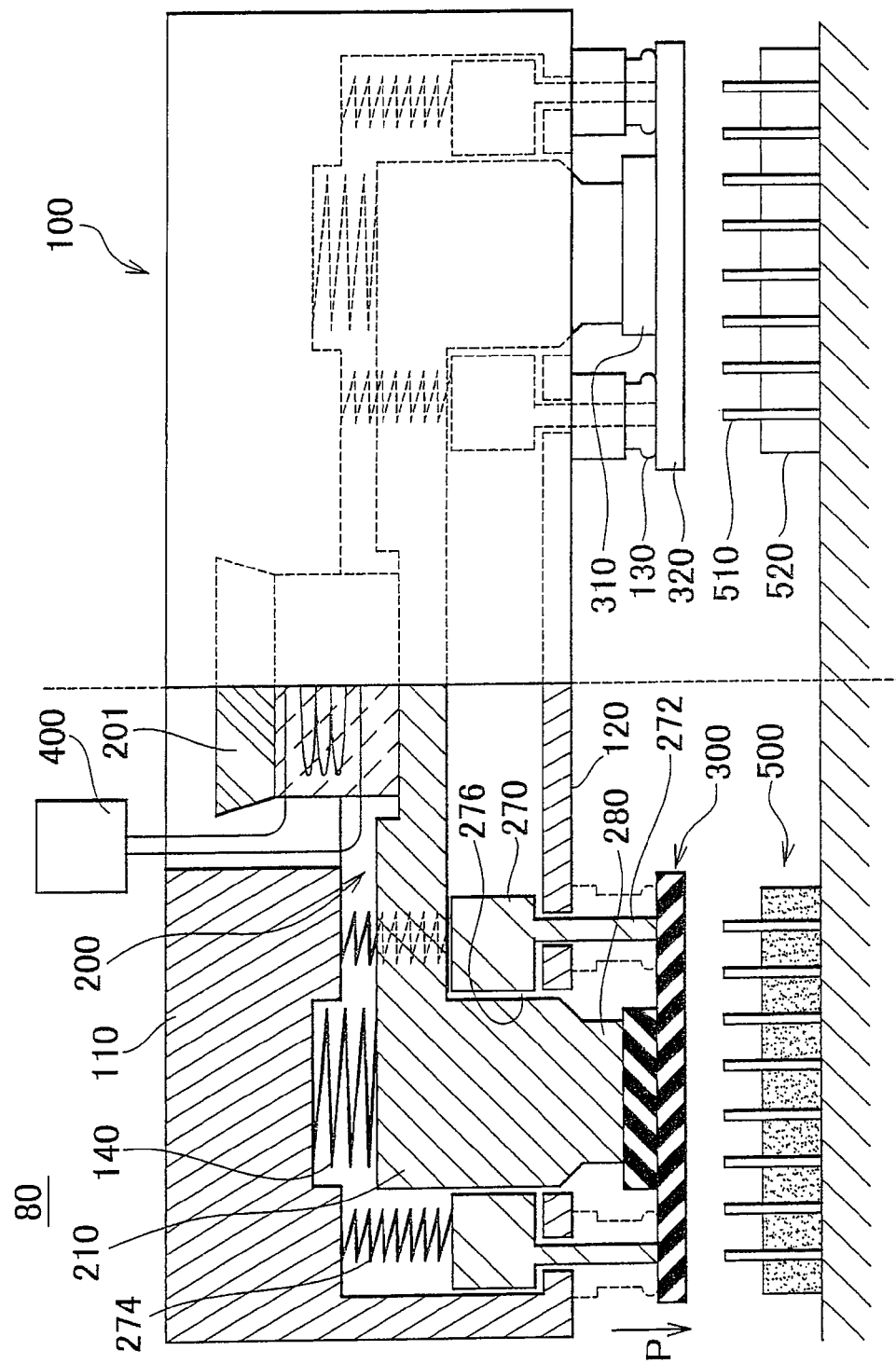
FIG. 8 is a cross-sectional view showing the configuration of a pusher unit 80 according to another embodiment.

FIG. 8 is a vertical cross-sectional view showing the configuration of a pusher unit 80 according to another embodiment. In FIG. 8, structural elements common to other Figures are given the same reference numerals and identical descriptions are omitted. In FIG. 8, the left side is a partial cross-sectional view of obtained by dividing the pusher 200 vertically in the center, and the right side is a partial frontal view of the pusher 200. In the embodiment shown in FIG. 8, the device pushing section is independently provided with a heat conducting section 280 for transferring heat to the base 310 of each semiconductor device under test 300 and base pushing sections 270 that press the semiconductor devices under test 300 onto the test sockets 500.

In the present embodiment, the heat conducting section 280 and the main body section 210 are formed in an integrated manner. Accordingly, the thermal conductivity between the heat conducting section 280 and the main body section 210 is good. The base pushing sections 270 each have a square ring-shaped main body that surrounds the heat conducting section 280 and include a leg section 272 extending from the main body. Furthermore, push springs 274 having weak elasticity are inserted between the upper ends of the base pushing sections 270 and the case upper section 110. The lower ends of the base pushing sections 270 are supported by the case lower section 120.

The pusher unit 80 configured as described above holds the semiconductor devices under test 300 and lowers the semiconductor devices under test 300 onto the test sockets 500. At this time, the surfaces of the heat conducting section 280 and the base 310 are not in contact with each other. Next, the device terminals on the lower surface of the substrate 320 of the semiconductor devices under test 300 are brought into contact with the contact pins 510 of the test sockets 500. In this condition, when the pusher unit 80 falls further, the surfaces of the heat conducting section 280 and the bases 310 are brought into contact with each other as a result of the compression of the weakly elastic push springs 274 of the base pushing sections 270.

In this manner, a good electrical connection can be ensured between the device terminals of the semiconductor devices under test 300 and the contact pins 510 of the test sockets 500. Here, in a case where the surfaces of the heat conducting section 280 and the bases 310 are slanted, it is desirable that pins having a long pushing stroke (e.g., pogo pins) be used on the contact pin 510 side. In such a case, the semiconductor devices under test 300 are moved to bring the surfaces of the heat conducting section 280 and the bases 310 into close contact with each other.

Here, because the fixed heat conducting section 280 does not move in relation to the main body section 210, priority is given entirely to contacting the bases 310 to contribute to the thermal conduction. Even in a case where there is a variation in slant, height, or the like of the substrate 320, the elastically supported base pushing sections 270 can be gently displaced to bring the heat conducting section 280 and the bases 310 into close contact with each other.

Each pusher unit 10, 30, 40, 50, 60, 70, 80 described above can achieve favorable thermal coupling with the semiconductor devices under test 300 regardless of which pushing section from among the plurality of device pushing sections 220, 230, 240, 250, 260, 280 or base pushing sections 270 are provided to simultaneously push the plurality of semiconductor devices under test 300. Therefore, by using a single pusher unit 10, 30, 40, 50, 60, 70, 80 in the semiconductor test apparatus 20, the plurality of semiconductor devices under test 300 can be uniformly heated or cooled.

Furthermore, the pusher unit can be formed by combining a plurality of configurations from among the embodiments described above. For example, by combining the configuration shown in FIG. 1 with the configuration shown in FIG. 5, a pusher unit is realized that can respond to variations in both the slant and thickness of the semiconductor devices under test 300. Furthermore, the regulating component 530 shown in FIG. 3 can be effectively applied to any of the other embodiments.

In the pushers 200 of the series of pusher units 10, 30, 40, 50, 60, 70, 80, 90 described above as embodiments, configurations in which the device pushing sections 220, 230, 240, 250, 260 are movable or are elastically supported are not only advantageous when used in a test apparatus 20 that heats or cools semiconductor devices under test 300, but can also be used advantageously in a pusher unit that simply pushes the semiconductor devices under test 300 without thermal conduction.

In other words, because the entire pushing surface of each device pushing section 220 uniformly contacts the semiconductor devices under test 300, problems such as a large regional pressure being applied to the semiconductor devices under test 300 or the device pushing sections 220 being damaged by an edge of the pushing section 20 are prevented. Accordingly, a pusher unit can be realized that can push a plurality of semiconductor devices under test 300 with a single pusher 200 while performing testing with the same test quality as that of a pusher unit pushing a single semiconductor device under test 300.

The embodiments described above are each provided with a plurality of device pushing sections 220, 230, 240, 250, 260. However, the configurations of the device pushing sections 220, 230, 240, 250, 260 can be applied to a pusher unit 90 provided with a single device pushing section 220.

Figure 9:
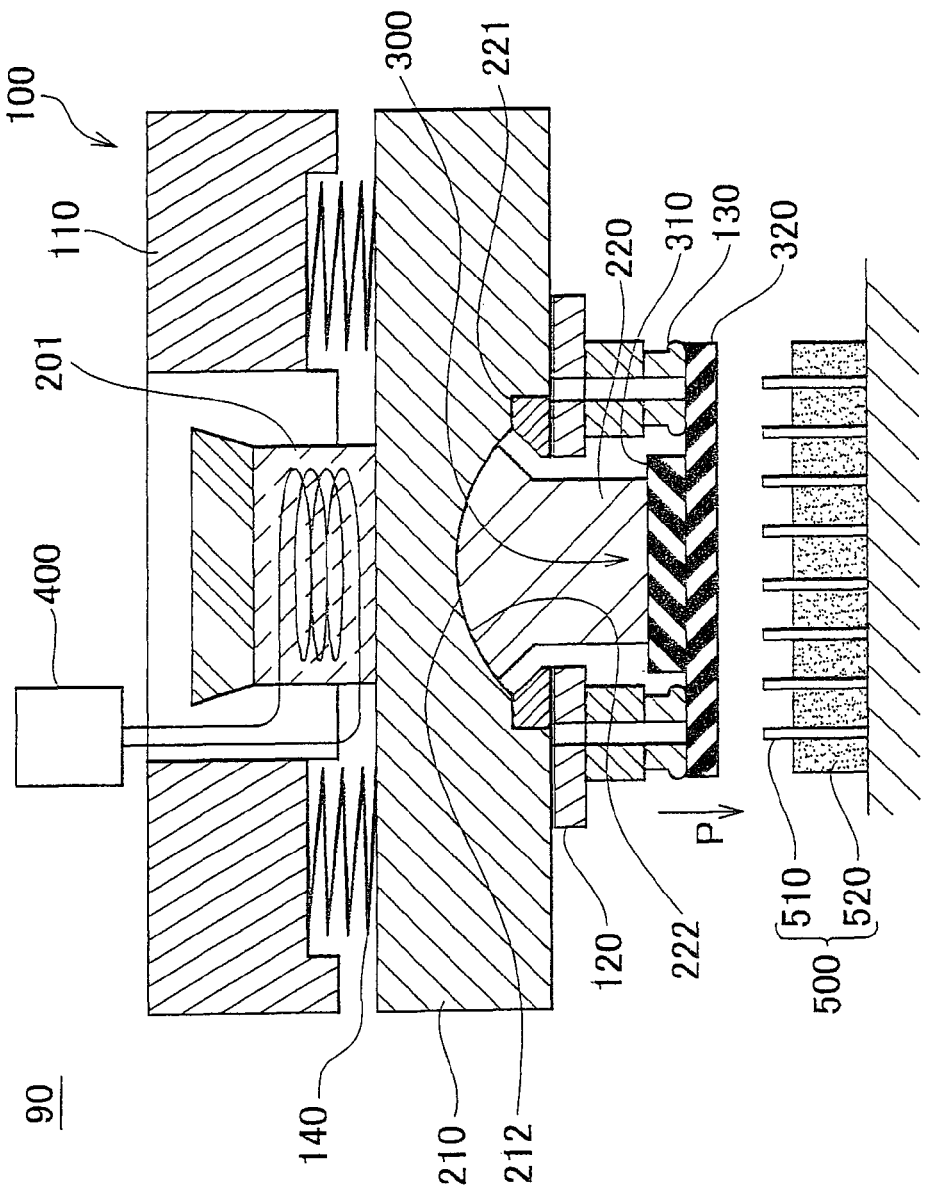
FIG. 9 is a cross-sectional view showing the configuration of a pusher unit 90 according to another embodiment.

FIG. 9 is a cross-sectional view showing an example of a pusher unit 90 that pushes a single semiconductor device under test 300. As shown in FIG. 9, the pusher unit 90 is provided with a single device pushing section 220 attached to the pusher unit 10 in the same configuration as shown in FIG. 1.

In the present embodiment, in the same manner as the embodiment shown in FIG. 1, the device pushing section 220 has the rounded end 222 supported in the rounded cradle section 212. Accordingly, the device pushing section 220 is displaced in response to the slant of the semiconductor device under test 300 to closely contact the surface of the semiconductor device under test 300. Therefore, thermal conduction between the main body section 210 and the device pushing section 220 and thermal conduction between the device pushing section 220 and the base 310 are both good. Because of this, such a configuration is advantageous for a semiconductor device under test 300 that has a particularly large variation in slant due to a manufacturing variation.

Furthermore, the series of pusher units 10, 30, 40, 50, 60, 70, 80, 90, described as embodiments can, as an alternative to being provided in combination with the semiconductor test apparatus 20, be provided independently as change kits and attached to a preexisting semiconductor test apparatus 20. Yet further, the pusher 200 can be supplied independently and combined with a preexisting pusher unit.

Figure 10:
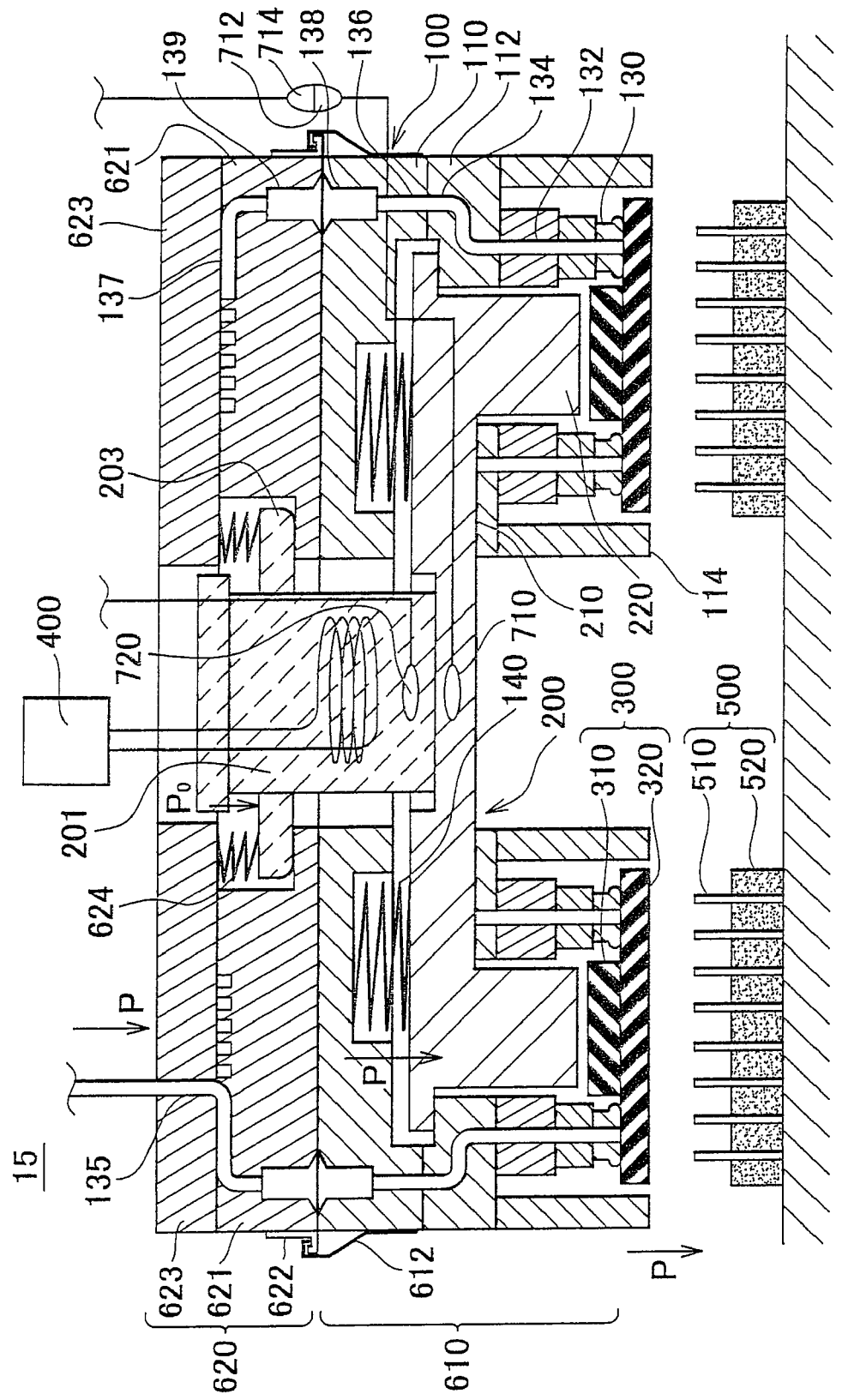
FIG. 10 is a cross-sectional view showing the configuration of a pusher unit 15 according to another embodiment.

FIG. 10 is a cross-sectional diagram schematically showing a configuration of an embodiment of the pusher unit 15 in which a change kit 610 that includes the pusher 200 can be easily replaced. In FIG. 10, structural elements common to other Figures are given the same reference numerals and identical descriptions are omitted.

As shown in FIG. 10, the pusher unit 15 is provided with a permanent section 620 that includes the thermal coupling section 201 and a change kit section 610 that includes the pusher 200 and that can be attached to and detached from the permanent section 620. The permanent section 620 and the change kit section 610 are joined to each other by latches 622, 612 attached to the surfaces of the permanent section 620 and the change kit section 610. It should be noted that the latches 622, 612 can be released, so that the change kit section 610 can be detached.

In the pusher 15 described above, the permanent section 620 is provided with a case section, which is formed by stacking the lower case 621 and the upper case 623, and the thermal coupling section 201 that includes the flange section 203 in an integrated manner. The flange section 203 is biased by the elastic component 624 to push downward with a pressure P to push down on the pusher 200, described hereinafter, from above. In a case where the pusher 200 is displaced for some reason, the thermal coupling section 201 can ascend or tilt in response to the displacement.

The permanent section 620 is further provided with a connection tube 135 that passes vertically through the upper case 623 and the lower case 621 and a connector 139 that is joined to a bottom end of the connection tube 135 and opens in a lower surface of the lower case 621. A decompression source, not shown, is joined to an upper end of the connection tube 135.

The change kit section 610 is provided with the unit case 100, which is formed by the lower case 112 and the upper case, and the pusher 200 that is biased by the push spring 140 in a downward direction against the unit case 100. Furthermore, the plurality of holding sections 130 are attached to a lower surface of the unit case 100.

Here, the internal section 132 of each holding section 130 is linked to the connectors 138 that open in an upper surface of the case upper section 110 via connection tubes 134, 136 formed in the lower case 112 and the case upper section 110. Furthermore, a connectors 138 is coupled with the connector 135 attached to a lower surface of the permanent section 620. Accordingly, with the permanent section 620 and the change kit section 610 in a joined condition, the internal section 132 of the holding section 130 is joined with the decompression source. Here, in an internal portion of the lower case 621 of the permanent section 620, the connection tube 135 is joined to a plurality of branching sections 137, so that each of the plurality of holding sections 130 is joined to the decompression source. Furthermore, side wall components 114 are attached to outer sides of each holding section 130 to ensure the position of the held semiconductor devices under test 300.

The pusher unit 15 formed in the manner described above can hold the semiconductor devices under test 300 on the holding sections 130 by driving the decompression source joined to the holding sections 130. The pusher unit 15 lowers the semiconductor devices under test 300 onto the test sockets 500 and pushes down on the permanent section 620 from above with the pressure P to push the pusher 200 via the push springs 140. As an end result of such an operation, the semiconductor devices under test 300 are pushed against the contact pins 510 of the test sockets 500 via the device pushing section 220.

In the operation described above, the pusher 200 contacting the semiconductor devices under test 300 is contacted from above by the thermal coupling section 201 and pushed by the elastic component 624. Furthermore, the thermal coupling section 201 can conform to a displacement or slant of the pusher 200 because the thermal coupling section 201 is elastically supported. Accordingly, the pusher 200 can be effectively coupled with the thermal source 400 because the entire lower surface of the thermal coupling section 201 closely contacts the pusher 200.

Furthermore, in a case where the heights of the upper surfaces of a pair of semiconductor devices under test 300 are different for some reason, both semiconductor devices under test 300 can be uniformly pushed because the pusher 200 can be displaced in relation to the unit case 100. In a case where the semiconductor devices under test 300 are slanted for some reason, the contact pins expand or contract through elasticity to conform to the slant within a compressing or expanding range of the contact pins. Accordingly, the entire lower surface of the device pushing section 220 of the pusher 200 closely contacts the semiconductor devices under test 300. Therefore, good thermal coupling is achieved between the thermal source 400 and the semiconductor devices under test 300.

It is obvious that the configurations of the device pushing sections 220 in the pusher units 10, 30, 40, 50, 60, 70, 80, 90 according to the embodiments described above can be applied as the device pushing section 220 of the pusher 200 in the pusher unit 15 described above. By doing this, good thermal coupling can be achieved between the device pushing section 220 and the semiconductor devices under test 300, in the manner described above.

As another embodiment, a temperature sensor may be attached to the pusher unit 15. More specifically, as shown in FIG. 10, the temperature during testing of the semiconductor can be accurately managed by disposing temperature sensors 710, 720 in a vicinity of the connection between the thermal coupling section 201 and the pusher 200. Here, the temperature sensors 710, 720 may be disposed on the thermal coupling section 201 side, on the pusher 200 side, or on both sides.

In a case where the temperature sensor 720 is disposed on the thermal coupling section 201 side, the temperature sensor 720 can monitor the coupling of the thermal source 400 and the thermal coupling section 201 by comparing the temperature change of the thermal coupling section 201 and the temperature generated by the thermal source 400. In a case where the temperature sensor 710 is disposed on the pusher 200 side, the temperature sensor 710 can monitor the amount of heat actually transferred to the pusher 200. In a case where the temperature sensors 720, 710 are disposed on both the thermal coupling section 201 side and the pusher 200 side, the temperature sensors 720, 710 not only monitor each of the temperatures described above, but can also monitor the thermal coupling of the thermal coupling section 201 and the pusher 200.

It should be noted that the above is only one example, and the temperature sensors can be arranged in many other locations. Furthermore, as shown in FIG. 10, the temperature sensor 710 attached to the change kit section 610 side is joined to the semiconductor test apparatus via connectors 712, 714. Accordingly, the temperature sensor 710 can be connected to the semiconductor test apparatus as necessary, even when the change kit section 610 is replaced as described below.

Figure 11:
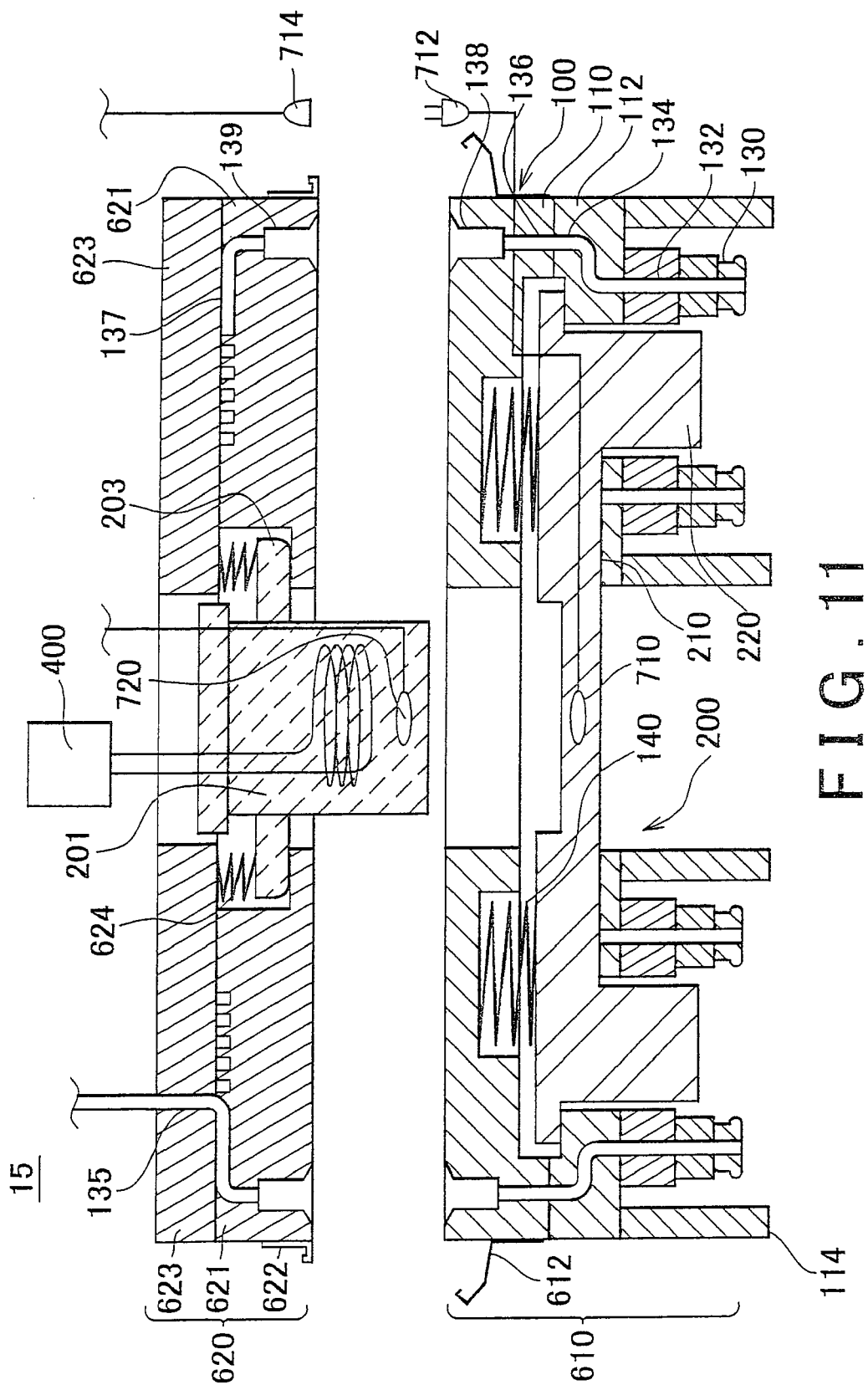
FIG. 11 is a cross-sectional view showing a condition in which a change kit 610 is separated from the pusher unit 15 of FIG. 10.

FIG. 11 shows the pusher unit 15 of FIG. 10 in a condition where the latches 612, 622 are released and the change kit section 610 is detached. As shown in FIG. 11, the change kit section 610 can be separated from the permanent section 620. Therefore, another change lit section 610 can be attached, as long as the latches 612 and the connectors 138 have the same positions.

FIG. 12 shows an example of such a situation. More specifically, a pusher unit 16 shown in FIG. 12 is formed by attaching a change kit section 630 that is different from the pusher unit 15 to the permanent section 620 that is the same as that of the pusher unit 15 described in FIGS. 10 and 11.

In the change kit section 630 attached here, the pusher 200 is directly pushed by the case upper section 110, without using the intervening push spring 140. Furthermore, the device pushing section 220 is formed in a manner to directly hold the semiconductor devices under test 300 without being provided with holding sections 130.

More specifically, the device pushing section 220 is provided with a through hole 133 that passes vertically through an internal portion thereof. The through hole 133 connects with the connection hole 136 formed in the case upper section 110 and also connects with the connector 139 of the permanent section 620 via the connector 138. Accordingly, the through hole 133 is joined to the decompression source, so that the semiconductor devices under test 300 can be held on the lower surface of the device pushing section 220 by suction.

The dimensions of the semiconductor devices under test 300 handled here are substantially the same as those of the base 312 and the substrate 322. Accordingly, in the configuration where the holding sections 130 are attached having a large distance therebetween as shown in FIGS. 10 and 11, the semiconductor devices under test 300 cannot be held. On the other hand, in the pusher unit 16 shown in FIG. 12, the semiconductor devices under test 300 can be held regardless of the dimensions of the substrate 322 because the device pushing section 220 itself has a suction function.

Furthermore, there is good thermal conduction between the device pushing section 220 and the semiconductor devices under test 300 because the device pushing section 220 directly holds the semiconductor devices under test 300 through suction. Accordingly, the heat of the thermal coupling section 201 is effectively transmitted to the semiconductor devices under test 300.

FIG. 13 shows the pusher 16 of FIG. 12 in a condition where the permanent section 620 and the change kit section 630 are separated. As shown in FIG. 13, the permanent section 620 is the same as the permanent section 620 of the pusher unit 15 shown in FIGS. 10 and 11.

The change kit section 630 has an independent configuration, as described in reference to FIG. 12, and is provided with the pusher 200 that can directly hold the semiconductor devices under test 300. It should be noted that the connectors 138 in the change kit section 630 are arranged in the same position as in the change kit section 610 shown in FIGS. 10 and 11. Accordingly, testing of various types of semiconductor devices under test 300 can be performed easily by using the configuration in which the change kits 610 or 630 can be replaced on a common permanent section 620.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A pusher, comprising:
   a main body section; and
   a plurality of device pushing sections that are thermally coupled to a common thermal source, wherein
   each of the plurality of device pushing sections is supported on the main body section in a manner to move in relation to the main body section, contacts a surface to be pushed of a semiconductor device under test by moving to conform to a slant of the surface to be pushed, pushes the surface to be pushed such that each of the semiconductor devices under test is pushed onto a test socket of a semiconductor test apparatus and heat from the thermal source is transmitted to the semiconductor devices under test, and rotates to conform to the slant of the surface to be pushed.

2. The pusher according to claim 1, wherein
   the main body section is thermally coupled to the thermal source,
   the plurality of device pushing sections are physically and thermally coupled to the main body section, and
   the plurality of device pushing sections push each of the semiconductor devices under test against a test socket of a semiconductor test apparatus and transmit heat from the thermal source to the semiconductor devices under test.

3. The pusher according to claim 2, wherein the plurality of device pushing sections are attached to the main body section.

4. A pusher, comprising:
   a main body section; and
   a device pushing section that is supported on the main body section in a manner to move in relation to the main body section, wherein
   the device pushing section contacts a surface to be pushed of a semiconductor device under test, closely contacts the surface to be pushed by moving to conform to a slant of the surface to be pushed, uniformly pushes the surface to be pushed to push the semiconductor device under test against a test socket of a semiconductor test apparatus, and rotates to conform to the slant of the surface to be pushed.

5. The pusher according to claim 4, wherein
   the main body section is thermally coupled to a thermal source, and the device pushing section is physically and thermally coupled to the main body section, is supported on the main body section in a manner to move in relation to the main body section, and pushes the surface to be pushed of the semiconductor device under test, wherein the device pushing section:
  contacts the surface to be pushed of the semiconductor device under test,
  closely contacts the surface to be pushed by moving to conform to a slant of the surface to be pushed,
  uniformly pushes the surface to be pushed to push the semiconductor device under test against a test socket of a semiconductor test apparatus, and
  transmits heat from the thermal source to the semiconductor device under test.

6. The pusher according claim 4, wherein
  the device pushing section has a rounded end portion,
  the main body section has a cradle section in a shape that complements the end portion, and
  the end portion is inserted into the cradle section to be joined therewith.

7. The pusher according to claim 4, wherein a plurality of the device pushing sections are attached to one main body section.

8. A pusher unit that holds a semiconductor device under test in a semiconductor test apparatus and pushes the semiconductor device under test against a test socket, comprising:
  a thermal source;
  a pusher that pushes the semiconductor device under test against the test socket and that transmits heat from the thermal source to the semiconductor device under test; and
  a holding section that holds the semiconductor device under test, wherein
  the pusher includes a main body section and a plurality of device pushing sections that are supported on the main body section in a manner to move in relation to the main body section, at least one of the device pushing sections moving to conform to a slant of a surface to be pushed of the semiconductor device under test, and the at least one of the device pushing sections rotating to conform to the slant of the surface to be pushed.

9. The pusher unit according to claim 8, including a plurality of the holding sections, wherein
  the main body section is thermally coupled with the thermal source;
  the plurality of device pushing sections are physically and thermally coupled with the main body section; and
  the at least one of the device pushing sections contacts the surface to be pushed of the semiconductor device under test, pushes the semiconductor device under test against the test socket, and transmits the heat from the thermal source to the semiconductor device under test.

10. The pusher unit according to claim 8 including a plurality of the holding sections, wherein the pusher:
  closely contacts the surface of the semiconductor device under test by moving to conform to the slant of the surface of the semiconductor device under test.

11. A semiconductor test apparatus, comprising:
  a pusher that includes a thermal source, a main body section that is thermally coupled with the thermal source, and a device pushing section that is physically and thermally coupled with the main body section and is supported on the main body section in a manner to move in relation to the main body section to conform to a slant of a surface to be pushed of a semiconductor device under test; and to rotate to conform to the slant of the surface to be pushed;
  a holding section that supports the semiconductor device under test; and
  a test section that performs testing of the semiconductor device under test, which is attached to a test socket by the pusher.

12. The semiconductor test apparatus according to claim 11, comprising a plurality of the holding sections, wherein
  the pusher includes a plurality of the device pushing sections, and
  at least one of the plurality of device pushing sections contacts the surface to be pushed of the semiconductor device under test, pushes the semiconductor device under test against the test socket, and transmits heat from the thermal source to the semiconductor device under test.

13. The semiconductor test apparatus according to claim 11, wherein
  the pusher closely contacts a surface of the semiconductor device under test by moving to conform to a slant of the surface of the semiconductor device under test,
  the pusher pushes the semiconductor device under test against the test socket, and
  the pusher transmits the heat from the thermal source to the semiconductor device under test.

* * * * *